United States Patent
Withers et al.

(10) Patent No.: US 10,149,135 B1
(45) Date of Patent: Dec. 4, 2018

(54) METHODS AND APPARATUSES FOR WIRELESS COMMUNICATION WITH A BRUSH

(71) Applicant: Illinois Tool Works Inc., Glenview, IL (US)

(72) Inventors: Bradley Scott Withers, El Dorado Hills, CA (US); Corey Alan Hughes, Sacramento, CA (US); Erik Scott Nelson, Granite Bay, CA (US); Steven Kenneth Christie, Placerville, CA (US); Brent Allan Best, Rocklin, CA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 15/607,849

(22) Filed: May 30, 2017

(51) Int. Cl.
| | | |
|---|---|---|
| *H04Q 5/22* | (2006.01) | |
| *H04W 4/80* | (2018.01) | |
| *H04W 4/00* | (2018.01) | |
| *B08B 1/00* | (2006.01) | |
| *A46B 15/00* | (2006.01) | |
| *A46B 13/02* | (2006.01) | |

(52) U.S. Cl.
CPC ............... *H04W 4/80* (2018.02); *A46B 13/02* (2013.01); *A46B 15/001* (2013.01); *B08B 1/002* (2013.01); *H04W 4/008* (2013.01)

(58) Field of Classification Search
None
See application file for complete search history.

(56) References Cited

U.S. PATENT DOCUMENTS

| | | | | |
|---|---|---|---|---|
| 6,326,884 B1 * | 12/2001 | Wohlrabe | ............... | B26B 19/38 |
| | | | | 340/538.11 |
| 7,249,992 B2 * | 7/2007 | Kalenian | ............... | B24B 37/30 |
| | | | | 451/11 |
| 2011/0094537 A1 | 4/2011 | Ko | | |
| 2013/0196572 A1 | 8/2013 | Ko | | |

FOREIGN PATENT DOCUMENTS

WO     2008002735     1/2008

OTHER PUBLICATIONS

Int'l Search Report and Written Opinion for PCT/US2018/034360 dated Sep. 10, 2018 (14 pgs.).

* cited by examiner

*Primary Examiner* — K. Wong
(74) *Attorney, Agent, or Firm* — McAndrews, Held & Malloy, Ltd.

(57) ABSTRACT

Provided is a disclosure for embodiments for a brush with communication capabilities, which is configured to clean a surface of, for example, a semiconductor wafer, as well as an offline brush conditioning system and a CMP system that can communicate with the brush.

20 Claims, 10 Drawing Sheets

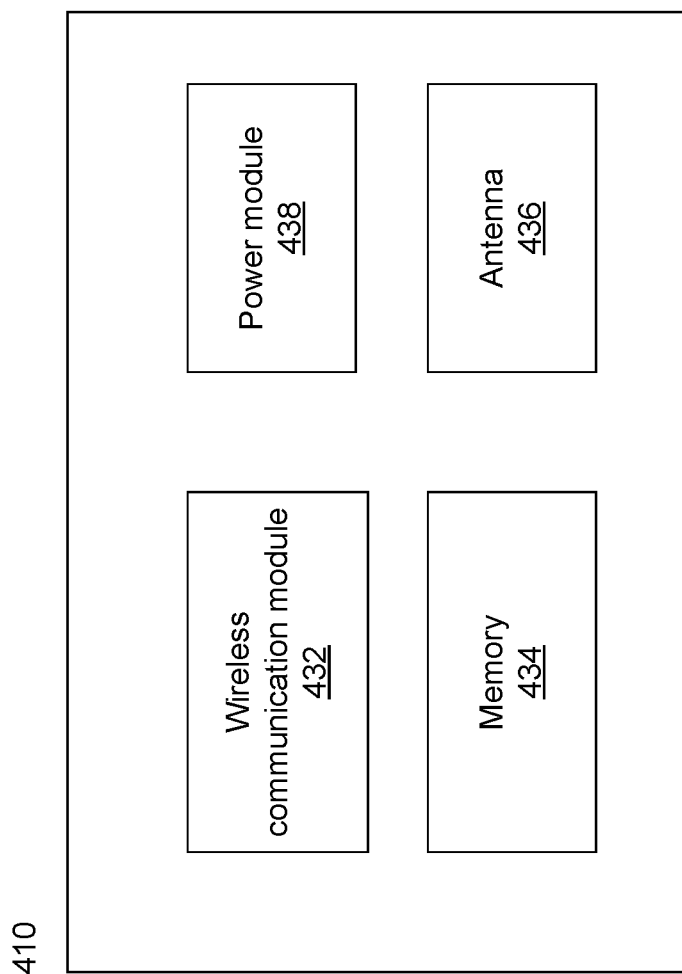

METHODS AND APPARATUSES FOR WIRELESS COMMUNICATION WITH A BRUSH

BACKGROUND

The present disclosure relates to wireless communication, and more particularly, to a methods and apparatuses for wireless communication with a brush.

In the semiconductor manufacturing industry and other industries, brushes are used to remove contaminants from surfaces, such as from semiconductor wafers. Conventional brushes are not received from the manufacturer in a condition to be used immediately. Instead, brushes are typically conditioned (or "broken in") before use on the intended products.

Limitations and disadvantages of conventional approaches to conditioning and use of a brush will become apparent to one of skill in the art, through comparison of such approaches with some aspects of the present method and system set forth in the remainder of this disclosure with reference to the drawings.

SUMMARY

Methods and apparatuses are provided for wireless communication for a brush, substantially as illustrated by and described in connection with at least one of the figures, as set forth more completely in the claims.

BRIEF DESCRIPTION OF THE DRAWINGS

These and/or other aspects will become apparent and more readily appreciated from the following description of the exemplary embodiments, taken in conjunction with the accompanying drawings.

FIG. 4C illustrates an example block diagram of the wireless device, in accordance with aspects of this disclosure.

The figures are not necessarily to scale. Where appropriate, similar or identical reference numbers are used to refer to similar or identical components.

DETAILED DESCRIPTION

Figure 1A:
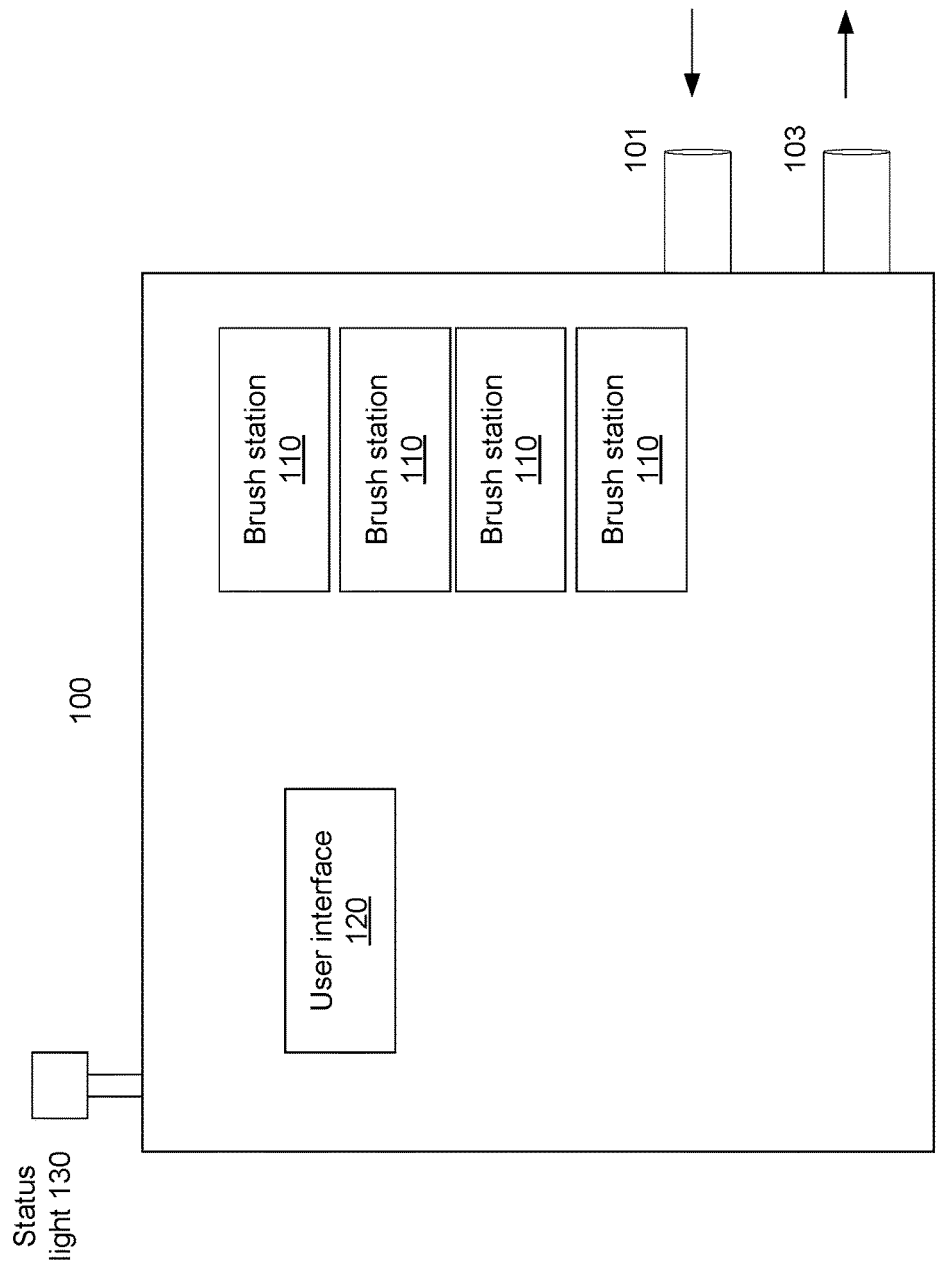
FIG. 1A shows a diagram of an example offline brush conditioning system, in accordance with aspects of this disclosure.

Various applications and processes may benefit from physical cleaning of an object's surface. For example, in semiconductor manufacturing a semiconductor wafer may be cleaned to remove potentially destructive contaminants during one or more stages of fabricating electronic circuits on the wafer. The cleaning can be provided by, for example, a brush that comes in contact with the surface to be cleaned. Conventional brushes are not received from the manufacturer in condition to be used immediately. For instance, the brush may have contaminants that counteract the cleaning of the object. Accordingly, there may be a desire to condition (season, break-in) the brush to remove the contaminants to an acceptable level for the intended use of the brush, and then use the conditioned brush for cleaning a surface. The brushes may also be tracked to know how many times, or for how long, the brushes have been used to clean surfaces.

While it should be understood that various embodiments of the disclosure may be used for different applications, example references in this disclosure will be made to cleaning a surface of a semiconductor wafer.

During a manufacturing process for a semiconductor wafer, a large number of contaminants may be found on the semiconductor wafer surface in the form of, for example, organic and/or inorganic particles. These contaminants will typically result in device failure and poor wafer yields. Moreover, with each new semiconductor technology node, the critical size of the defects on the semiconductor wafer and the tolerable number of defects on the semiconductor wafer becomes smaller.

The semiconductor industry may use post-chemical mechanical planarization (pCMP) cleaning in the manufacture of semiconductor devices where brushes such as, for example, polyvinyl acetate (PVAc) brushes, may be used in combination with application-specific cleaning agents and/or chemicals to remove particles from the semiconductor wafer surface.

The various brush types, including PVAc brushes, by nature of the material itself and/or the brush manufacturing/shipping process, will naturally release particles (organic and/or inorganic) when flushed and/or exposed to a fluid such as, for example, deionized water (DIW) and/or cleaning agents/chemicals. The quantity of particles released can be related to the nature of the fluid (DIW, cleaning agent, etc.) that the brush is exposed to, as well as the process conditions that the brush is used for (e.g., fluid flow rates, brush rotational speeds, etc.).

While the brushes may be cleaned by the brush manufacturer to reduce the level of releasable contamination prior to delivery to an end-user, an individual end-user may prefer a different threshold for the baseline-level of particle contamination in the brush.

Since some brushes are typically packaged, shipped, and stored in a hydrated state, with a preservation agent to prevent bacterial growth and product failure. The preservation, packaging, transportation, and storage process (e.g., shelf-life) may all adversely affect the intended pristine nature of the brush and contribute to the number of particles that can be released from the brush.

The nature of the brush manufacturing process, as well as the preservation, packaging, transportation, and/or shelf-life issues can all be compounding effects that require the end-user to condition (or season or break in) the brushes to remove some of the particles prior to using them in the semiconductor fabrication facility production tools.

The actual semiconductor layer being processed may dictate the level (and size) of acceptable particles that is released from the brush, and, hence, the time required to condition a brush. The time required for conditioning a brush may range from 10 minutes to 24 hours or more. Conventional methods of conditioning brushes involve performing a conditioning process using dummy wafers for cleaning the brush on the systems that perform the cleaning of the end product.

Various embodiments of the disclosure may describe communicating with the brushes to facilitate conditioning and/or use of the brushes.

Disclosed example systems for a brush for cleaning a surface of a semiconductor wafer, comprises a center core, cleaning material about the center core, and a wireless device associated with the brush.

Disclosed example methods for communicating with a brush configured for cleaning a surface of a semiconductor wafer, comprises communicating by an electronic device with a wireless device, wherein the wireless device is associated with the brush, to perform one or both of writing first data to a memory in the wireless device and reading second data from the memory in the wireless device.

Disclosed example offline brush conditioning systems comprise a first conditioning chamber configured to condition a first brush, a radio frequency identification (RFID) module configured to communicate with at least one RFID tag, wherein the at least one RFID tag comprises a first RFID tag that corresponds to the first brush, and a first RFID antenna configured to transmit and receive signals for communication between the RFID module and the first RFID tag.

As used herein, the term radio frequency identification, or RFID, refers to a set of technologies that use wireless electromagnetic transmissions to store electronic information on tags and/or access electronic information stored on the tags.

FIG. 1A shows a diagram of an example offline brush conditioning system, in accordance with aspects of this disclosure. Referring to FIG. 1A, there is shown the offline brush conditioning system 100, which may comprise one or more brush stations 110, a user interface 120, and a status light 130.

There may be any number of individual brush stations 110 that may be used to simultaneously condition multiple brushes. Each brush station 110 may receive one brush for conditioning, where the conditioning can include multi-step processing capabilities (e.g., compression of the brush, rotational speed of the brush, DIW flushing and/or rinsing, etc.). The multiple brush stations 110 may be set up to condition brushes with the same process and/or set up independently to condition brushes with different processes. Also, while the brush station 110 has been described as conditioning one brush, in other examples multiple brushes may be conditioned by one brush station 110.

When a brush station 110 conditions a single brush, that brush can be isolated from cross-contamination by other consumables. When a brush station 110 is configured to handle multiple brushes, there may be barriers to isolate one brush from another to reduce cross-contamination. The amount of contamination in the brush(es) may be monitored by a contamination monitor.

The user interface 120 (e.g., a touchscreen, a display panel, buttons, a keyboard and mouse, etc.) may be used to enter commands to condition the brush(es) in the brush station 110, and also to view the conditioning status of the brushes. For example, the user interface 120 may be used to monitor and control the torque/speed used to rotate the brush as the brush is being conditioned.

The status light 130 may, for example, blink and/or show different colors to alert the end-user to a processing state for the brushes. The statuses indicated by the status light 130 may be design dependent.

In operation, one or more brushes may be placed in the offline brush conditioning system 100 and the conditioning process started. The status light 130 may indicate, for example, when the conditioning for at least one brush is finished. If the different brush stations 110 are set up for different conditioning processes that may take different lengths of time, the user interface 120 may give further indication of the status for each brush station 110.

The offline brush conditioning system 100 may be coupled to a fluid delivery system 101 in order to receive fluid(s) for use by the offline brush conditioning system 100. The offline brush conditioning system 100 may also be coupled to a fluid discharge system 103 in order to return fluid(s) that have been used by the offline brush conditioning system 100. The fluid delivery system 101 and the fluid discharge system 103 may belong to, for example, the end-user.

Figure 1B:
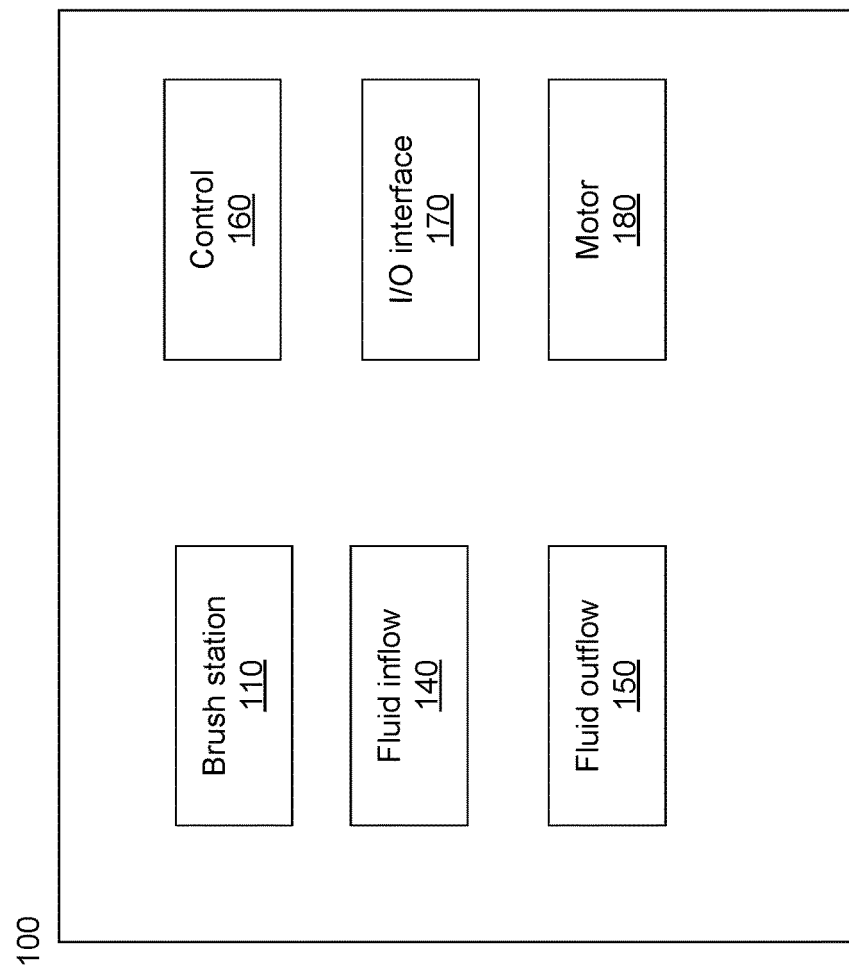
FIG. 1B is a block diagram of an example implementation of the offline brush conditioning system, in accordance with aspects of this disclosure.

FIG. 1B is a block diagram of an example implementation of the offline brush conditioning system, in accordance with aspects of this disclosure. Referring to FIG. 1B, there is shown the offline brush conditioning system 100 comprising the brush station 110, a fluid inflow system 140, a fluid outflow system 150, a control system 160, an input/output interface 170, and a motor system 180.

The brush station 110 may receive a brush that may be shaped like, for example, a cylindrical roller. While various embodiments of the disclosure may have a fixed axis for receiving the brush, other embodiments may allow receiving a brush at different angles and/or adjusting an angle after the brush has been received. This may allow for more flexibility in conditioning the brush and/or for accommodating different shapes of the brush.

The fluid inflow system 140 may comprise various fixtures for introducing fluids to the offline brush conditioning system 100 to be used for conditioning a brush and/or for other purposes. For example, there may be a fixture that couples to the fluid delivery system 101 for fluids such as, for example, chemicals for conditioning. Various embodiments of the disclosure may allow, for example, coupling to a plurality of fluid conduits provided by the fluid delivery system 101. Accordingly, this may allow for rapid change of fluids during use of the offline brush conditioning system 100. The fluid inflow system 140 may also comprise a distribution system for the received fluids to the brush(es) for conditioning the brush(es). Some embodiments may also have as part of the fluid inflow system 140 a container that may be used to store a fluid. This may be used to provide, for example, a buffer in cases of drop in pressure for the fluid inflow. This may also be used, for example, to allow the offline brush conditioning system 100 to be used when not connected to the end-user fluid supply line.

The fluid outflow system 150 may comprise various fixtures and devices for removing fluids that have been used in the process of conditioning a brush (i.e., effluent). In some embodiments, the fluid outflow system 150 may have dedicated outflow conduits that correspond to specific zones of the brush station 110. This may allow, for example, monitoring the effluents for characteristics of specific parts of a brush. The fluid outflow system 150 may, accordingly, comprise monitoring devices that can determine specific characteristics for the effluent.

The control system 160 may comprise various modules that control the operation of the offline brush conditioning system 100. For example, there may be one or more processors (microprocessors, microcontrollers, etc.) that execute code stored in memory and process data received from external devices or via the I/O interface 170. The processor(s) may then control operation of the brush conditioning process including the rotational speed of the brush and compression of the brush against a conditioning plate. This may allow, for example, controlling the level of conditioning (e.g., pressure, intensity, duration, chemistry, etc.) applied to the brush.

The processor(s) may also control switching among the plurality of fluids if the offline brush conditioning system 100 is coupled to receive different types of fluids from the end-user, or possibly using the container if the container is available.

The control system 160 may also control, for example, the flow rate of fluids such as chemicals and/or ultra-pure water (UPW). The characteristics of UPW will not be described as they may differ from application to application. Accordingly, it should be understood that UPW refers to water that is considered to have suitable "UPW" characteristics for an application at issue. The control system 160 may also, for example, control diluting a chemical using fluid from the container, if a container is available, or from another end-user conduit.

The I/O interface 170 may comprise various devices that may allow information and commands to be input to the offline brush conditioning system 100, as well as to display and/or communicate with external devices. For example, the user interface 120 may be a part of the I/O interface 170. The I/O interface 170 may also comprise, for example, one or more of various buttons, switches, LEDs/lights, keyboard, mouse, trackball, etc., for entering input as well as displaying outputs. The I/O interface 170 may also comprise various ports for wired communication such as USB ports, Ethernet ports, etc. The I/O interface 170 may also support wireless communication technologies and protocols such as, for example, cellular communication, Bluetooth communication, near field communication, Wi-Fi communication, RFID communication, etc.

The I/O interface 170 may be used to allow status to display at remote stations or devices and/or to allow remote control of the offline brush conditioning system 100. The I/O interface 170 may also allow updating of various software/firmware and applications in the offline brush conditioning system 100 via a wired or wireless connection. Additionally, the I/O interface 170 may allow remote control of the offline brush conditioning system 100.

The motor system 180 may comprise one or more motors that are used to rotate one or more brushes for conditioning. The motor(s) in the motor system 180 can comprise appropriate motors for rotating the brush(es) as they are conditioned. The motors in the motor system 180 may be controlled to have variable speed and/or torque. Various embodiments may also comprise a motor system that is able to provide information regarding a present torque. This information may be used to determine, for example, whether the conditioning is progressing as expected. Various embodiments may provide for one motor to drive one brush, while other embodiments may allow for one motor to drive multiple brushes. Still other embodiments may allow for one motor to drive a single brush or multiple brushes.

Figure 2:
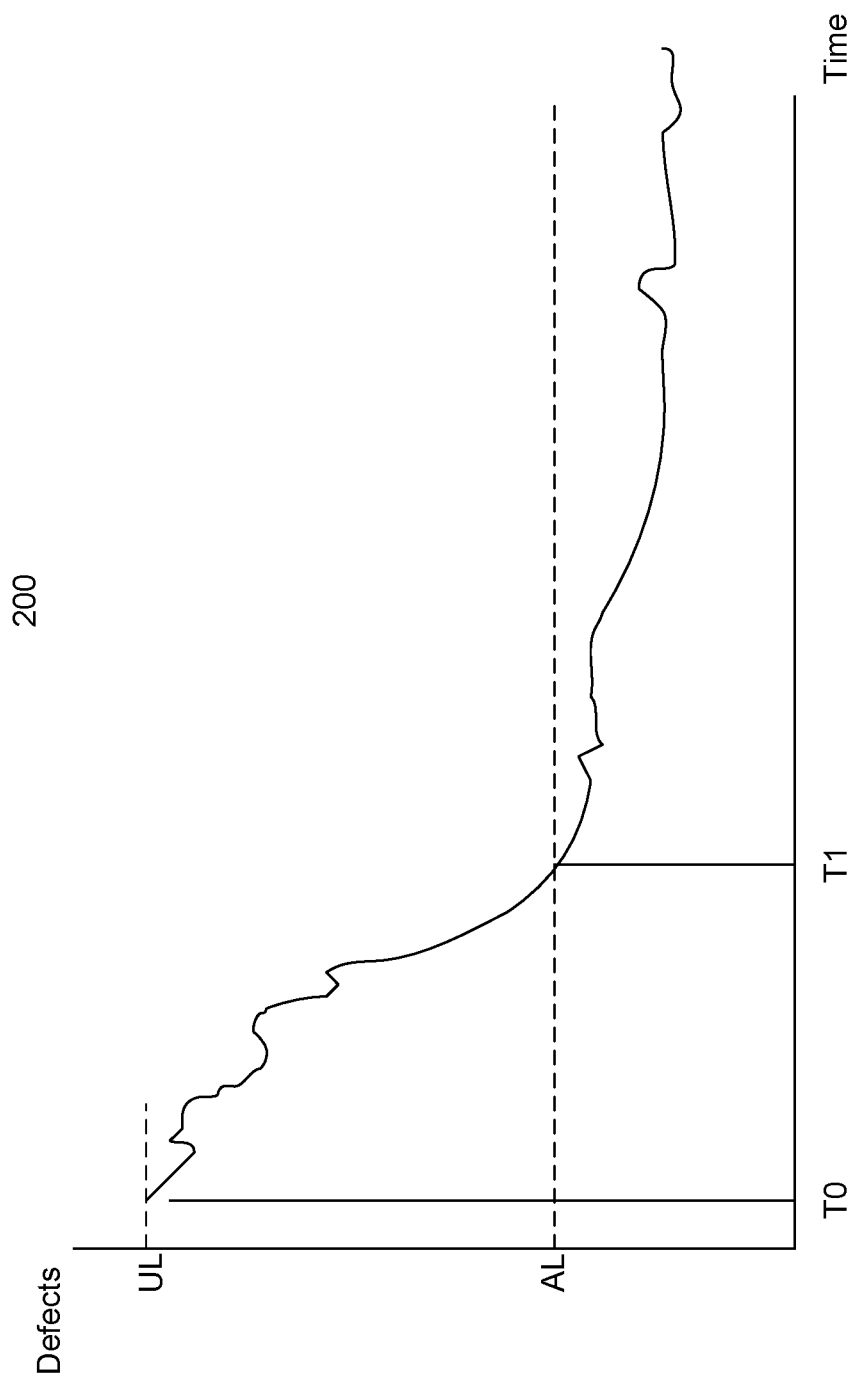
FIG. 2 is a graph illustrating an example relationship between defects and conditioning time.

FIG. 2 is a graph illustrating an example relationship between defects and conditioning time. Referring to FIG. 2, there is shown a graph 200 that shows defects on the Y-axis and time on the X-axis. At time T0 when brush conditioning first starts, there may an unacceptable level of "defect" of UL, where defect refers to the amount of particles released and/or size of particles released by a brush. The defect may be monitored by, for example, examining the effluent. As conditioning continues over time, the defect level may reduce to an acceptable level AL at time T1. The time T1 may vary depending on the defect level required. Any amount of time used to condition the brush(es) by the offline brush conditioning system 100 is the amount of time that the production system can continue to operate to produce semiconductor wafers, and thus save the end-user valuable production time and money. In some cases, a particular type of brush may be well characterized such that the conditioning can be set for a period of time without having to monitor the defects.

Figure 3:
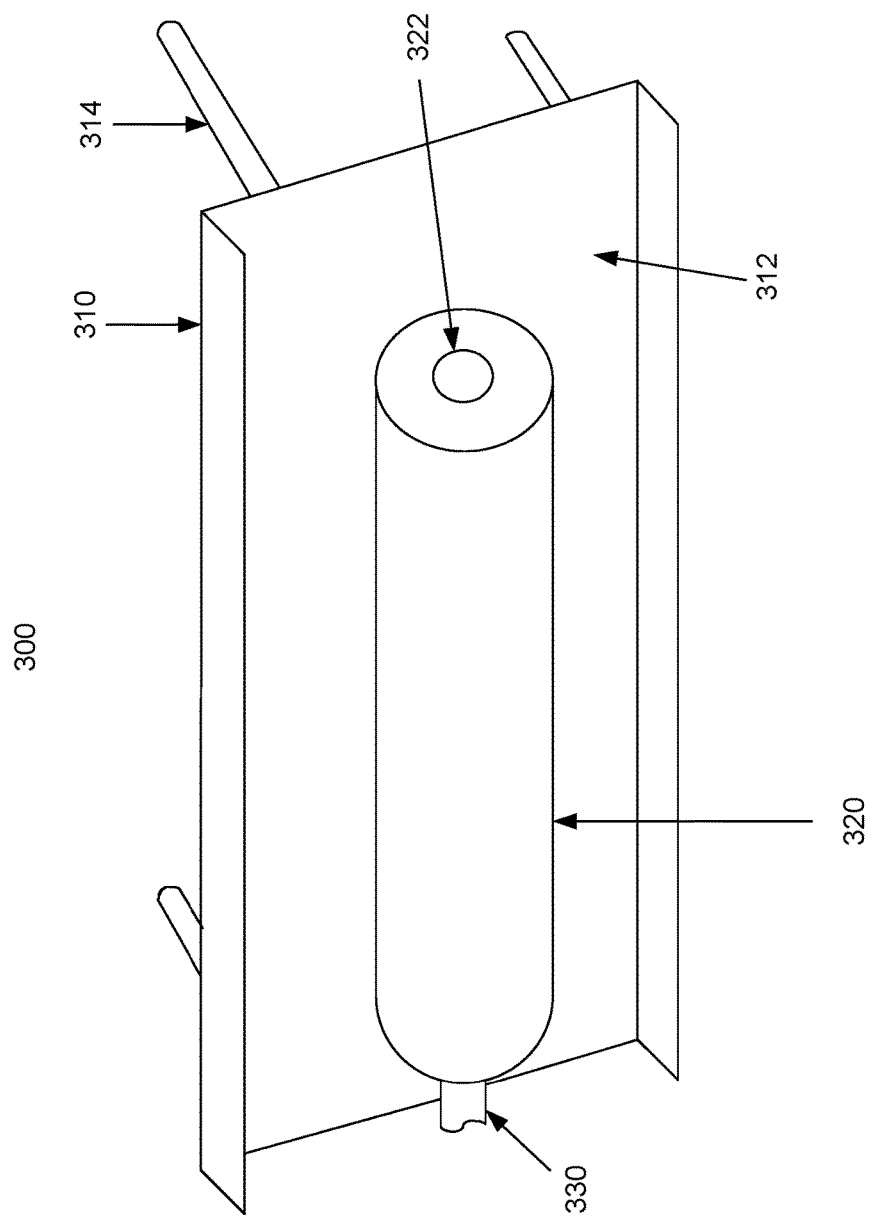
FIG. 3 illustrates an example arrangement of a brush and a conditioning plate for conditioning the brush, in accordance with aspects of this disclosure.

FIG. 3 illustrates an example arrangement of a brush and a conditioning plate for conditioning the brush, in accordance with aspects of this disclosure. Referring to FIG. 3, there is shown a diagram 300 that illustrates the conditioning plate (conditioning surface) 310 and the brush 320 in a brush station 110. The brush 320 comprises an axial opening 322. One end of the axial opening 322 may be used to hold the brush 320 when the brush 320 is used to clean a surface of, for example, a semiconductor wafer. When the brush 320 is being conditioned, a brush support 330 may be used to hold the brush 320. Example brush support 330 may include a bracket, a post, and/or any other type of support. The brush support 330 may be connected to the motor system 180. Fluids used to condition the brush may be introduced to the brush 320 via the end of the axial opening that is not coupled to the brush support 330. The brush support 330 may be adjusted to different sizes to allow for different sized axial openings that different brushes may have. Various other parts may be used to firmly fasten the brush 320 to the coupling part 322, however these parts will not be described in this disclosure as there are well known methods of fastening a structure such as a brush 320 to a brush support 330.

The conditioning plate 310 may be flat or have other shapes, such as, for example, a curved surface. The surface may be, for example, flat, concave, convex, tubular, meshed, and/or biased (e.g., left-to-right), etc., to alter the conditioning characteristics of the brush 320. The conditioning plate 310 may be made of appropriate materials such as, for example, glass, quartz, silicon dioxide, poly silicon, silicon nitride, silicon carbide, tungsten, titanium, titanium nitride, aluminum, aluminum oxide, tantalum, tantalum nitride, copper, ruthenium, cobalt, etc., depending on a nature of the surface that is to be cleaned by the conditioned brush (e.g., Si, $SiO_2$, SiC, SiOC, SiN, W, TiW, TiN, TaN, Cu, Ru, GaAs, GaP, InP, sapphire, any combination of these materials, etc.).

The surface 312 of the conditioning plate 310 can have different characteristics as needed for conditioning a brush 320. For example, the conditioning plate 310 can have a surface 312 that is smooth, rough, or contain abrasive material such as, for example, $SiO_2$, SiC, $Al_2O_3$, $CeO_2$, etc. Accordingly, to provide different characteristic(s) for the surface 312, the surface 312 may be replaced as appropriate, or the conditioning plate 310 may be replaced. The surface 312 used to condition the brush 320 can contact the entire brush or just a portion of the brush 320.

Different brushes 320 may have different sizes for the length, the diameter of the axial opening 322, and/or the outer diameter. The brush support 330 and the conditioning plate 310 may be adjusted and/or replaced to accommodate the different sizes and/or conditioning requirements. The control system 160 may also take into account the different sizes when controlling the motor speed/torque and/or introduction of fluid to condition the brush 320.

The conditioning plate 310 may be moved by a motor (not shown) that is connected to, for example, one or more of the legs 314. The motor may be, for example, a stepper-motor that can move the conditioning plate 310 forward to contact the brush 320, where the brush 320 may be stationary or rotating. The extent of contact between the conditioning plate 310 and the brush 320 can be monitored and controlled by distance (e.g., 0-5 mm of compression) and/or brush motor torque output. The monitoring and controlling may be performed by, for example, the control system 160.

Various embodiments may characterize (map) the pressure exerted by the brush 320 on the conditioning plate 310 via, for example, embedded or adhered tactile pressure sensors in the conditioning plate 310.

The torque data may be used to directly or indirectly verify the quality of the brush 320 (e.g., concentricity, brush uniformity, etc.). Various embodiments may also make adjustments to the conditioning process based on various feedback data such as, for example, contact area, pressure, force, etc. that may be collected by various pressure sensing devices.

As shown in an example in FIG. 3, the brush 320 is coupled on the left side to the brush support 330 to allow a motor to rotate the brush 320 at various speeds (e.g., up to 1000 RPM) and monitor the torque output of the motor as the brush 320 is conditioned. The right side of the brush 320 may allow delivery of fluid (chemical, UPW, etc.) to the interior of the brush 320. The delivery of fluid (chemical and/or UPW) may be to the outside surface of the brush 320. Various embodiments may deliver fluid to both the inside of the brush 320 and to the outside surface of the brush 320. Flow of fluid to the brush 320 may be controlled by, for example, one or more valves that may be controlled manually by an operator or automatically by the control system 160. The flow may be varied to different ranges such as, for example, an example range of 0-5 gallons per minute (GPM).

Furthermore, fluid may also be delivered to the conditioning plate 310. The delivery of the fluid to the conditioning plate 310 may be at an appropriate time for conditioning the brush 320. Additionally, some embodiments may allow different fluids to be delivered to the brush 320 and the conditioning plate 310.

Figure 4A:
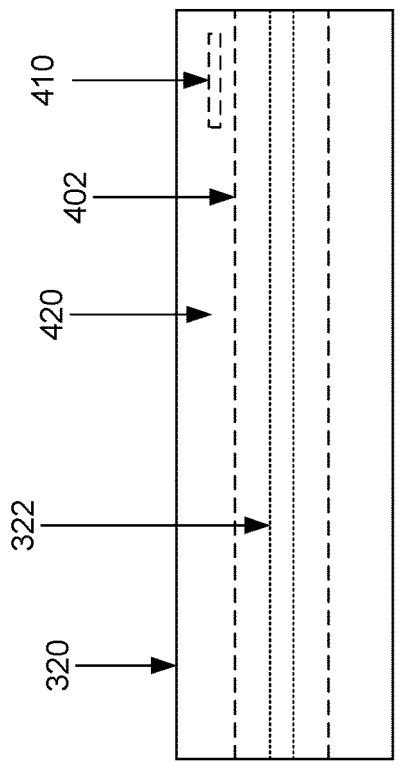
FIG. 4A illustrates an example of a brush with a wireless device, in accordance with aspects of this disclosure.

FIG. 4A illustrates an example of a brush with a wireless communication device, in accordance with aspects of this disclosure. Referring to FIG. 4A, there is shown the brush 320 with the axial opening 322 that is formed in a mandrel 402 (or a center core 402). Cleaning material 420 is shown around the mandrel 402. As shown in this example, a wireless device 410 may be embedded in the mandrel 402. The wireless device 410 may be, for example, a passive RFID tag (e.g., outgoing transmissions are powered by absorbing energy from incoming transmissions), an active RFID tag (e.g., transmissions internally powered, such as by a battery), and/or another type of device that can communicate wirelessly.

Figure 4B:
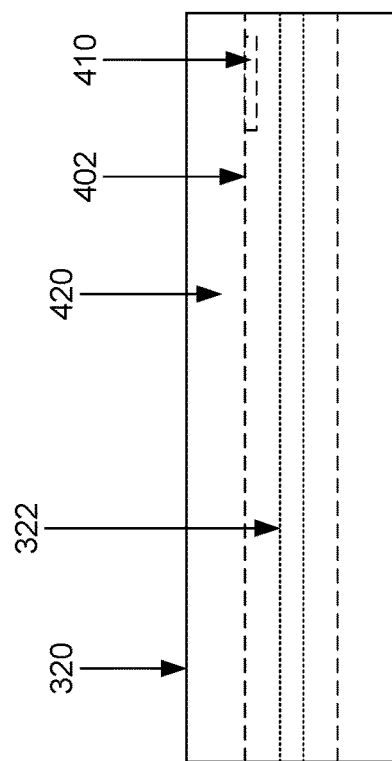
FIG. 4B illustrates another example of a brush with a wireless device, in accordance with aspects of this disclosure.

FIG. 4B illustrates another example of a brush with a wireless communication device, in accordance with aspects of this disclosure. Referring to FIG. 4B, there is shown the brush 320 that is similar to the brush 320 shown in FIG. 4A. The wireless device 410 may be attached to an outer surface of the mandrel 402 or attached to or embedded in the cleaning material 420 that surrounds the mandrel 402. The wireless device 410 can generally be attached to or embedded in the brush 320 where the placement of the wireless device 410 does not interfere with the conditioning of the brush 320 or use of the brush 320. Accordingly, the wireless device 410 may also be attached to an inner surface of the mandrel 402 or to an exposed end of the mandrel 402 if that placement does not interfere with the conditioning or use of the brush 320.

FIG. 4C illustrates an example block diagram of a wireless device, in accordance with aspects of this disclosure. Referring to FIG. 4C, there is shown the wireless device 410 that may generally comprise a processing module 432, a memory module 434, an antenna 436, and a power module 438.

The processing module 432 may comprise the circuitry and/or control system for communicating with external device(s) (not shown in FIG. 4C). The processing module 432 may, for example, process and/or decode received signals from the external device, perform the tasks requested by the external device if needed, and encode signals to be transmitted.

The memory module 434 may comprise volatile and/or non-volatile memory for storing instructions and/or data. Portions of the memory module 434 may be write-once memory. This may be to prevent sensitive data from being over-written once the sensitive data has been written to memory. A sensitive data may be, for example, a number of times that a brush has been used. For example, every time a brush is used, a new data may be written to a different location to indicate the use. Accordingly, as an example, it may be possible to keep track of the number of times a brush has been used without the possibility of over-writing with an inaccurate usage number. Generally, a write access can be deemed to also include erase access.

Other methods may also be used to protect data. For example, a command may be sent to prevent a write access to certain memory locations. Or, in the example of the usage tracking value, software may be used to allow a write to a usage tracking memory location with only a value that is one larger than the present value.

The antenna 436 is used to receive and transmit signals to and from the external device. The power module 438 is used to provide power from, for example, a battery, or other power storing device for active wireless devices. For passive wireless devices such as, for example, a passive RFID tag, the power module 438 may comprise the circuitry to store power from received wireless signals to be able to perform functions such as, for example, perform read access and/or write access to the memory module 434.

Various embodiments may use an active wireless device or a passive wireless device that is able to perform appropriate functions. The RFID tag (whether active or passive) is an example of a wireless device that may be used with various embodiments of the disclosure.

Figure 5A:
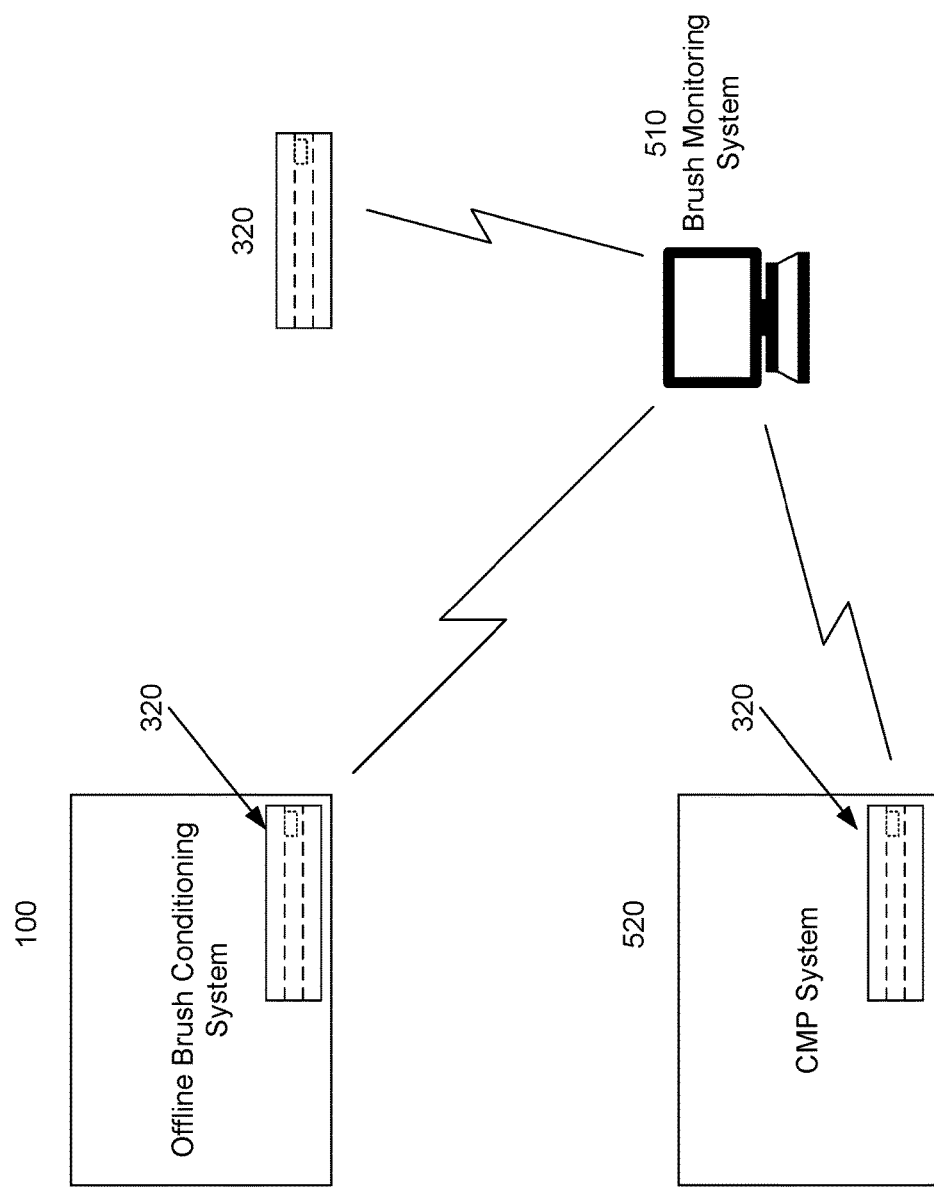
FIG. 5A illustrates examples of communication between a brush monitoring system and a brush, in accordance with aspects of this disclosure.

FIG. 5A illustrates examples of communication between a brush monitoring system and a brush, in accordance with aspects of this disclosure. Referring to FIG. 5A, there is shown a brush monitoring system 510 that is configured to communicate with one or more brushes 320. The brush 320 may be in the offline brush conditioning system 100, in the CMP system 520, or in stock to be used later. The brush monitoring system 510 may be, for example, a server configured to communicate with various wireless devices such as, for example, an RFID tag 410, which may be passive or active. The brush monitoring system 510 may be able to read information from the RFID tag 410 or send write commands to write data to the RFID tag 410. The write commands may be able to specify, for example, specific locations in memory of the RFID tag 410 or specific types of memory in the RFID tag 410.

Accordingly, the brush monitoring system 510 can communicate with the brushes 320 in stock to determine the number of brushes 320 that are available at a given time. The brush monitoring system 510 may also be able to query the brushes 320 to determine whether they have been used, and, if so, how many times.

The brush monitoring system 510 may be able to read other brush characteristics such as, for example, a brush identification number, a batch number, a product identifier, brush dimensions, conditioning history, contamination profile, or information indicative of a conditioning process to be used to condition the brush. The vendor of a brush 320 may be identified by the brush characteristic information, or the vendor information may be part of the brush characteristic information. The conditioning process may be written to the memory module 434 by, for example, the manufacturer of the brush 320. The conditioning process 320 may also be written to the memory module 320 by an end user based on previous history of the specific type of the brush 320. This information may be gathered, for example, from previous conditioning of the brushes 320 or from previous use of the brushes 320.

In some embodiments, the brush monitoring system 510 may be able to broadcast or selectively address a wireless device 410 for communication. Other embodiments may use very short range communication to communicate with the nearest brush 320. The brush 320 may be addressed by a communication device (not shown) that may in turn communicate with the brush monitoring system 510. The communication device may be carried, for example, by an employee or a robot, or the brushes 320 may move, for example, on a conveyor belt, past the communication device.

While the brush characteristics have been described when the brushes 320 are not being conditioned or not being used, the brush characteristics may be read and/or written (updated) while a brush 320 is in the offline brush conditioning system 100 or in the CMP system 520. Accordingly, the offline brush conditioning system 100 may use the various brush characteristics to condition the brush 320 appropriately.

The CMP system 520 may use the brush 320 to clean a surface of an object such as, for example, a semiconductor wafer. Accordingly, the CMP system 520 may use the various brush characteristics to ensure, for example, that a correct brush 320 is in place for cleaning a specific object in the CMP system 520.

Figure 5B:
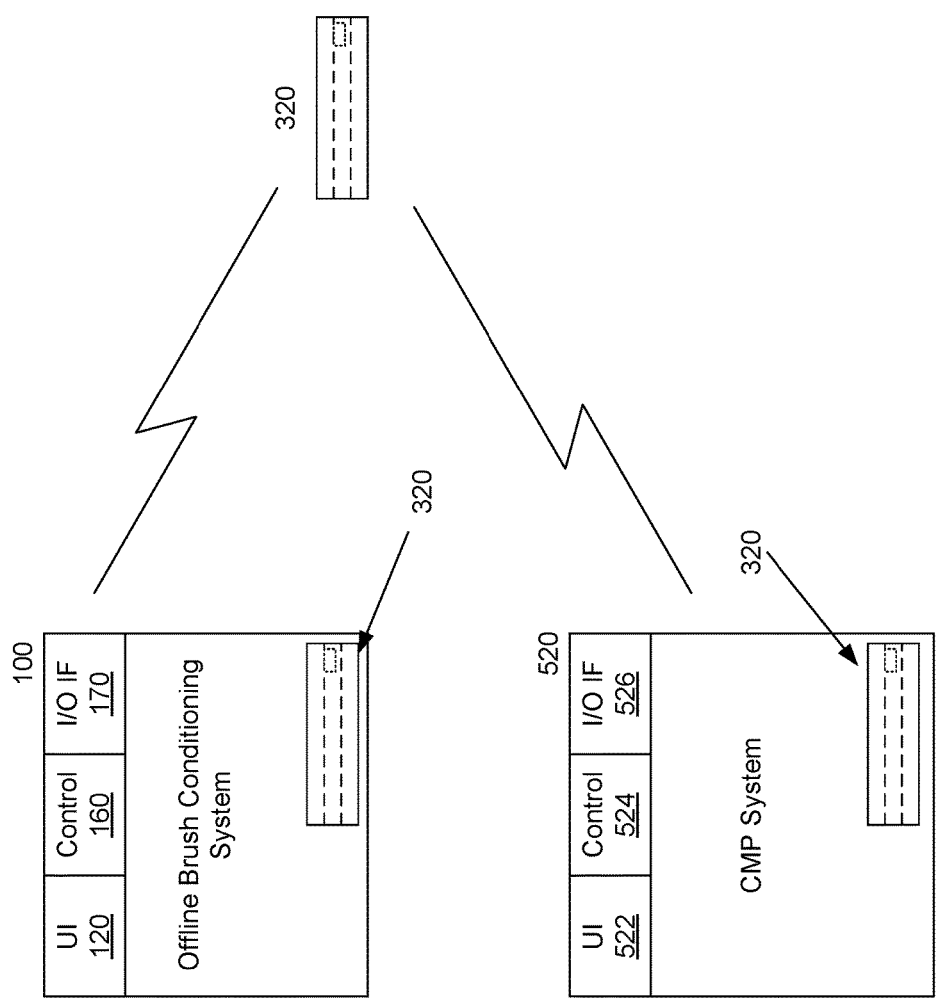
FIG. 5B illustrates examples of a brush communicating with an offline brush conditioning system and a CMP system, in accordance with aspects of this disclosure.

FIG. 5B illustrates examples of a brush communicating with an offline brush conditioning system and a CMP system, in accordance with aspects of this disclosure. Referring to FIG. 5B, there is shown an offline brush conditioning system 100 that is able to communicate with a brush 320 in the offline brush conditioning system 320 and/or with a brush 320 outside the offline brush conditioning system 320. There is also shown a CMP system 520 that is able to communicate with a brush 320 in the CMP system 520 and/or with a brush 320 outside the CMP system 520.

Accordingly, while FIG. 5A introduced the brush monitoring system 510 to communicate with the brush 320, various embodiments of the disclosure need not be limited so. For example, various embodiments of the offline brush conditioning system 100 may have at least the UI 120, the control system 160, and the input/output interface 170 with appropriate functionality to allow the offline brush conditioning system 100 to similarly perform the tasks described in FIG. 5A.

Similarly, the CMP system 520 may also have the capability to be able to communicate with the brush 320 in the CMP system 520 or outside the CMP system 520. Accordingly, the CMP system 520 may have, for example, at least a user interface (UI) 522, a control system 524, an input/output interface 526, etc., that may allow the CMP system 520 to similarly perform the tasks described in FIG. 5A.

Figure 6:
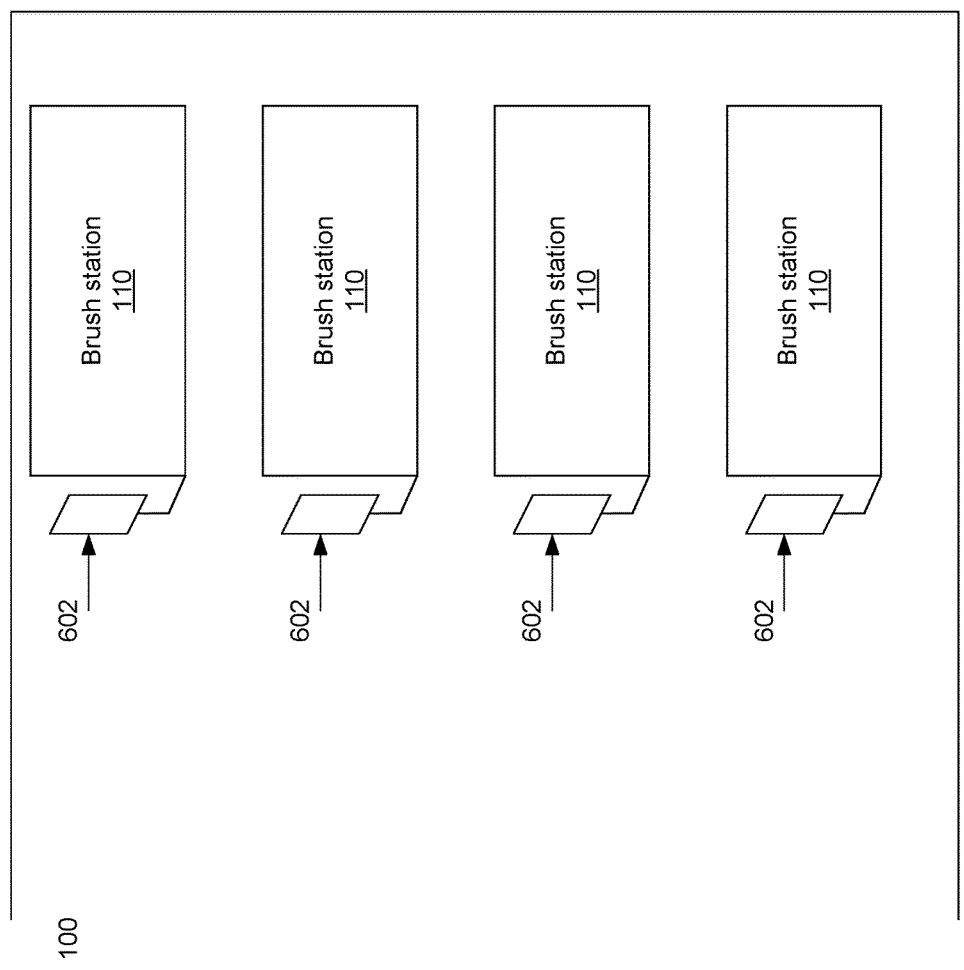
FIG. 6 illustrates an example placement of antennae in an offline brush conditioning system for communication with a wireless device associated with a brush, in accordance with aspects of this disclosure.

FIG. 6 illustrates an example placement of antennae in an offline brush conditioning system for communication with a wireless device associated with a brush, in accordance with aspects of this disclosure. Referring to FIG. 6, there is shown an offline brush conditioning system 100 with four brush stations 110 where each brush station 110 has an associated antenna 602 for wireless communication.

Each antenna 602 may be placed such that it communicates signals with the brush 320 in its associated brush station 110 without substantially interfering with any other antenna/brush communication at other brush stations. Accordingly, communication between an antenna 602 and a brush 320 in its associated brush station 110 is not substantially affected by interference from other antennas 602 communicating with other brushes 320 in their associated brush stations 110.

Figure 7:
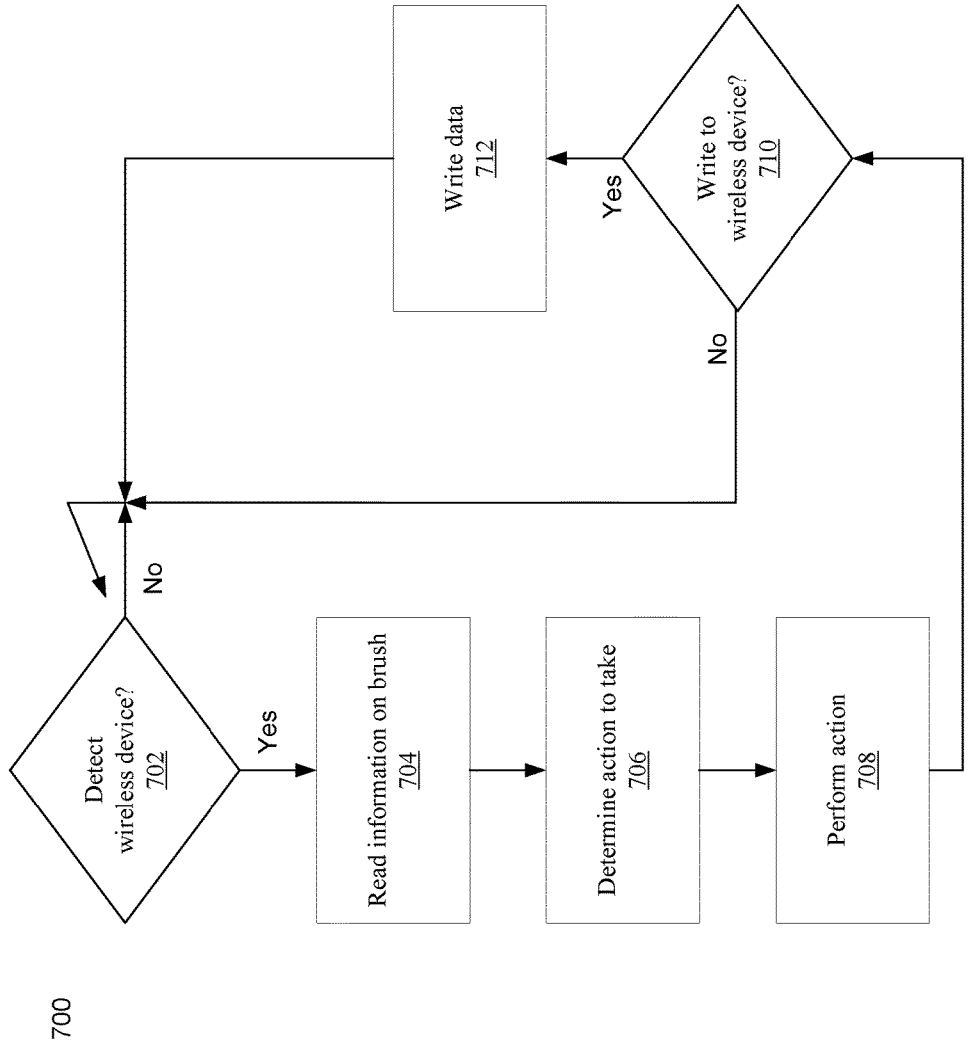
FIG. 7 is a flow diagram of an example method of communicating information between a brush and a brush monitoring system, in accordance with aspects of this disclosure.

FIG. 7 is a flow diagram of an example method of communicating information between a brush and a brush monitoring system, in accordance with aspects of this disclosure. Referring to FIG. 7, there is shown the flow diagram 700, where at block 702 the brush monitoring system 510 determines whether a wireless device 410 has been detected. If a wireless device 410 has been detected at block 702 by the brush monitoring system 510, then the brush monitoring system 510 reads the wireless device information at block 704. If wireless device 410 has not been detected at block 702, the brush monitoring system 510 will continue to look for a wireless device 410. The specific method of detecting a wireless device 410 will depend on the protocol used by the brush monitoring system 510.

After reading the wireless device information at block 704, the brush monitoring system 510 may determine at block 706 what action is needed. For example, if the brush monitoring system 510 is communicating with an offline brush conditioning system 100, then the brush monitoring system 510 may read the desired brush characteristic information to set up the offline brush conditioning system 100 for conditioning the specific brush 320 in the brush station 110. If the brush monitoring system 510 is communicating with the CMP system 520, then the brush monitoring system 510 may read the desired brush characteristic information to set up the CMP system 520 for cleaning an object with the brush 320. If the brush 320 is not in the offline brush conditioning system 100 or the CMP system 520, the brush monitoring system 510 may then read the brush characteristic information needed to keep track of the brushes 320 in stock.

At block 708, an appropriate action determined at block 706 may be taken by, for example, the brush monitoring system 510. At block 710, a determination is made by the brush monitoring system 510 as to whether information needs to be written to the brush 320. If there is no information to be written, then the process goes to block 702. If there is information to be written, then it is written at block 712 by the brush monitoring system 510. The information may be, for example, for the brush 320 at the offline brush conditioning system 100, to increment the number of times the brush has been conditioned, the specific process used for conditioning, etc. For the brush 320 at the CMP system 520, the information may be, for example, to increment the number of times the brush has been used, how long the brush has been used this time or in total, etc. For the brush 320 in stock, the information written may be, for example, some updated information regarding the brush 320 and how it may be conditioned or used.

From block 712, the process continues at block 702.

Additionally, while the flow diagram 700 described a process using the brush monitoring system 510, another process may be performed in part or entirely without the brush monitoring system 510. As described with respect to FIG. 5B, the offline conditioning system 100 and/or the CMP system 520 may communicate directly with the brush 320.

Accordingly, while a specific process was described in the flow diagram 700, various embodiments may use other flow diagrams.

The present methods and systems may be realized in hardware, software, and/or a combination of hardware and software. The present methods and/or systems may realize, for example, the control system 160 in a centralized fashion in at least one computing system, or in a distributed fashion where different elements are spread across several interconnected computing systems. Any kind of computing system or other apparatus adapted for carrying out the methods described herein is suited. A typical combination of hardware and software may include a general-purpose computing system with a program or other code that, when being loaded and executed, controls the computing system such that it carries out the methods described herein. Another typical implementation may comprise one or more application specific integrated circuit or chip. Some implementations may comprise a non-transitory machine-readable (e.g., computer readable) medium (e.g., FLASH memory, optical disk, magnetic storage disk, or the like) having stored thereon one or more lines of code executable by a machine, thereby causing the machine to perform processes as described herein. As used herein, the term "non-transitory machine-readable medium" is defined to include all types of machine readable storage media and to exclude propagating signals.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or." As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g." and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

What is claimed:

1. A brush for cleaning a surface of a semiconductor wafer, comprising:
   a center core;
   cleaning material about the center core; and
   a wireless device associated with the brush.

2. The brush of claim 1, wherein the wireless device is a passive RFID tag.

3. The brush of claim 1, wherein the wireless device is attached to or embedded in the brush.

4. The brush of claim 1, wherein the wireless device comprises memory, and at least a portion of the memory is configured to provide write access and read access.

5. The brush of claim 1, wherein the wireless device comprises memory, and at least a portion of the memory is write-once memory.

6. The brush of claim 1, wherein the wireless device comprises memory, and the wireless device is configured to receive a command to disable write access to at least a portion of the memory.

7. The brush of claim 1, wherein the wireless device comprises memory, and the memory is configured to store brush characteristic data.

8. The brush of claim 7, wherein the brush characteristic data comprises one or more of: a brush identification number, a batch number, a product identifier, brush dimensions, conditioning history, contamination profile, or information indicative of a conditioning process to be used to condition the brush.

9. The brush of claim 1, wherein the brush is configured to be used with one or more of: an off-line brush conditioning system, a brush monitoring system, or a chemical mechanical planarization system.

10. A method for communicating with a brush configured for cleaning a surface of a semiconductor wafer, comprising:
    communicating by an electronic device with a wireless device, wherein the wireless device is associated with the brush, to perform one or both of writing first data to a memory in the wireless device and reading second data from the memory in the wireless device.

11. The method of claim 10, further comprising transmitting, by the electronic device, brush characteristic data associated with the brush to be stored in the wireless device.

12. An offline brush conditioning system, the system comprising:

a first conditioning chamber configured to condition a first brush;

an RFID module configured to communicate with at least one RFID tag, wherein the at least one RFID tag comprises a first RFID tag that corresponds to the first brush; and a first RFID antenna configured to transmit and receive signals for communication between the RFID module and the first RFID tag.

13. The system of claim 12, wherein the first RFID antenna is mounted outside the first conditioning chamber.

14. The system of claim 12, wherein the first RFID antenna and the first conditioning chamber are configured to allow the first RFID antenna to communicate with only the first RFID tag among the at least one RFID tag.

15. The system of claim 12, further comprising a second conditioning chamber with a second RFID antenna, wherein when there is a second brush with a corresponding second RFID tag in the second conditioning chamber, the communication between the first RFID antenna and the first RFID tag does not substantially interfere with communication between the second RFID antenna and the second RFID tag, and the communication between the second RFID antenna and the second RFID tag does not substantially interfere with the communication between the first RFID antenna and the first RFID tag.

16. The system of claim 12, wherein the first conditioning chamber is configured to condition the first brush based on information from the first RFID tag.

17. The system of claim 12, further comprising a control system configured to control the first conditioning chamber to condition the first brush based on information from the first RFID tag, wherein the information from the first RFID tag is received by the control system via the RFID module.

18. The system of claim 12, further comprising a storage device configured to store one or both of information from the first RFID tag and information about the first brush, wherein the information about the first brush is gathered at least during conditioning of the first brush.

19. The system of claim 12, wherein the RFID module is configured to communicate to the first RFID tag at least some information collected during conditioning of the first brush.

20. The system of claim 12, wherein the RFID module is configured to send a command to the first RFID tag to prevent write access to one or more memory locations.

* * * * *